United States Patent [19]
Miyashita

[11] Patent Number: 5,654,709
[45] Date of Patent: Aug. 5, 1997

[54] ANALOG SIGNAL SAMPLING CIRCUIT CONSTRUCTED WITH FIELD-EFFECT TRANSISTORS

[75] Inventor: Takumi Miyashita, Kawasaki, Japan

[73] Assignee: Fujitsu Limited, Kawasaki, Japan

[21] Appl. No.: 252,094

[22] Filed: May 31, 1994

[30] Foreign Application Priority Data

Aug. 30, 1993 [JP] Japan ................ 5-214483

[51] Int. Cl.$^6$ ................................... H03M 1/60
[52] U.S. Cl. .......................................... 341/122
[58] Field of Search ............................ 341/122

[56] References Cited

U.S. PATENT DOCUMENTS

| | | | |
|---|---|---|---|
| 4,395,708 | 7/1983 | Lloyd | 340/784 |
| 4,922,130 | 5/1990 | Swerlein | 307/353 |
| 5,047,666 | 9/1991 | Astegher | 307/353 |
| 5,172,117 | 12/1992 | Mills et al. | 341/157 |

Primary Examiner—Jeffrey A. Gaffin
Assistant Examiner—Jason H. Vick
Attorney, Agent, or Firm—Staas & Halsey

[57] ABSTRACT

The present invention is intended to realize an analog signal sampling circuit constructed with field-effect transistors wherein errors caused by parasitic capacitance or gate conductance in a switch device is reduced. The sampling circuit of the invention comprises an inverting amplifier, a capacitor, a first switch for selecting a reference voltage Vref or a target signal Vin for input to the capacitor, and a second switch for opening or closing the connection between the input and output of the inverting amplifier, and produces an output in proportion to the difference between the target signal Vin and reference voltage Vref held in the capacitor, the sampling circuit being characterized by the inclusion of a voltage converting circuit whereby the operating voltage of the clock signal applied to the gate of the field-effect transistor forming the second switch is converted to a voltage related to the self-bias level of the inverting amplifier.

15 Claims, 13 Drawing Sheets

$$V = \frac{(V_{in} - V_{ref}) \cdot C}{C + C_a}$$

GATE VOLTAGE RANGE

INVERTING AMPLIFIER OUTPUT

CK

THRESHOLD VALUE

GATE VOLTAGE RANGE

GATE VOLTAGE RANGE

CK $|V_{thpch}|$

INVERTING AMPLIFIER OUTPUT

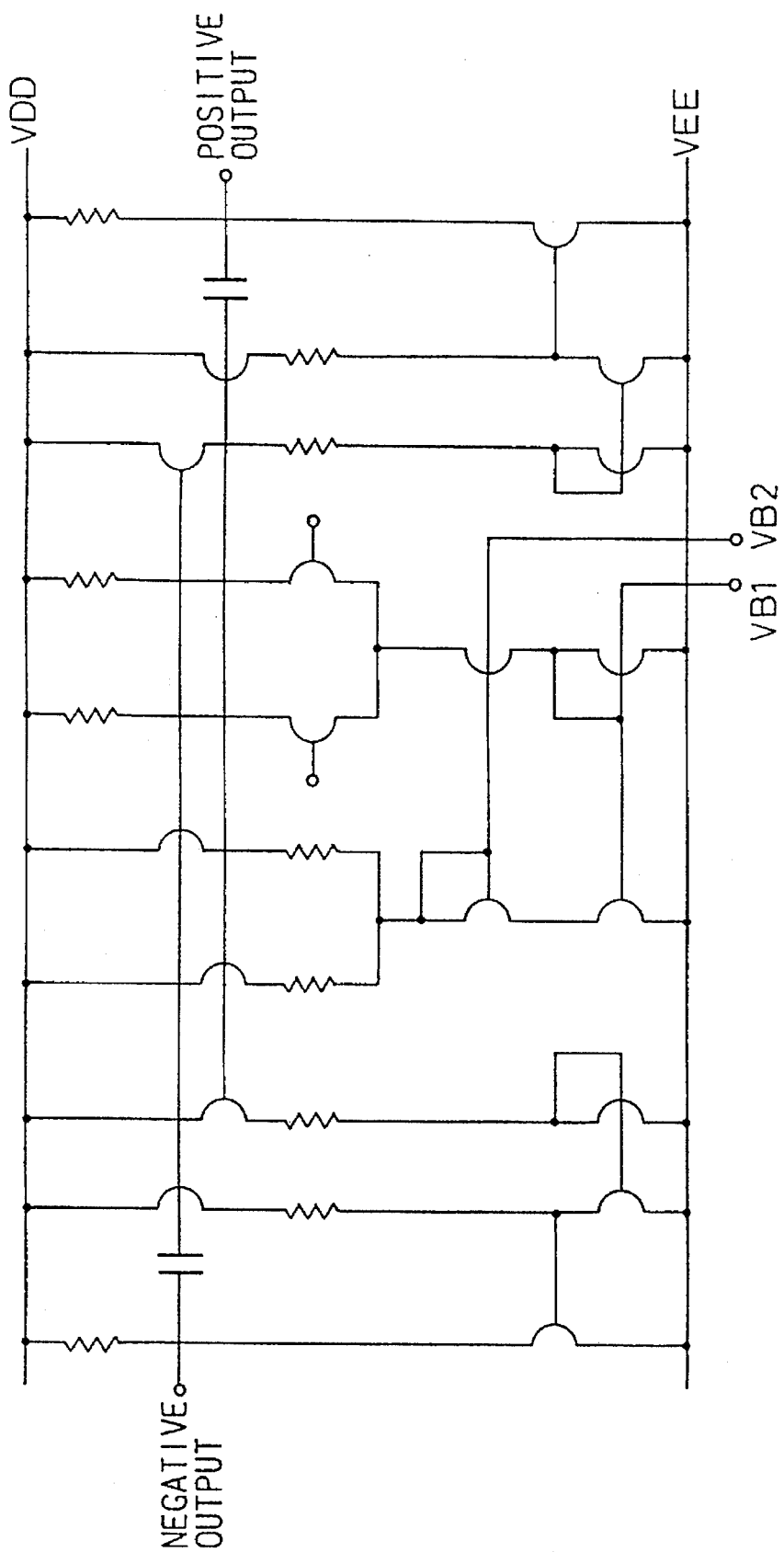

ANALOG SIGNAL SAMPLING CIRCUIT CONSTRUCTED WITH FIELD-EFFECT TRANSISTORS

BACKGROUND OF THE INVENTION

1. Field of the Invention

The present invention relates to an analog signal sampling circuit, constructed with field-effect transistors, for use in a successive-approximation A/D converter or the like, and more particularly to a sampling circuit containing an inverting amplifier and a capacitor wherein the input to the capacitor is switched in accordance with a clock signal between a signal voltage to be measured and a reference voltage, while the input and output of the inverting amplifier are short-circuited in accordance with the clock signal, thus obtaining an output proportional to the difference between the signal voltage and reference voltage held in the capacitor.

2. Description of the Related Art

In recent systems, a digital signal converted from an analog signal is processed at high speed using a digital signal processor (DSP). The digital signal thus processed is converted back into an analog signal for output, or is stored in memory. With recent advances in MOS (metal-oxide semiconductor) and MES (metal semiconductor) technologies, the functional capabilities and operating speeds of DSPs have been increasing rapidly, and at the same time, it has become possible to accommodate an A/D converter and D/A converter on the same chip with a DSP, thus making possible the construction of a desired circuit with fewer chips. In such an A/D converter, an analog signal sampling circuit is often used.

A typical analog signal sampling circuit comprises an inverting amplifier, a capacitor, a first switch for switching the input to the capacitor between a sampled signal voltage and a reference signal in accordance with a clock signal, and a second switch for connecting and disconnecting the input terminal of the inverting amplifier to and from the output terminal thereof in accordance with the clock signal. With the first and second switches alternately conducting in accordance with the clock signal, the inverting amplifier outputs a voltage that is proportional to the difference between the signal voltage and the reference voltage.

In such an analog signal sampling circuit, a parasitic capacitance is present between the input terminal of the inverting amplifier and the gate of the second switch. Since the voltage on one plate of this parasitic capacitance changes with the clock signal, the amount of charge stored in the parasitic capacitance changes according to the state of the clock signal, which affects the voltage being applied to the input terminal of the inverting amplifier, resulting in an error.

In low-resolution A/D conversion systems, this error does not present any serious problems, but in high-resolution A/D conversion systems, this error is not negligible; hence, there arises the need to reduce this error.

SUMMARY OF THE INVENTION

It is an object of the present invention to reduce errors caused by parasitic capacitance in a switch device in an analog signal sampling circuit constructed with field-effect transistors.

A second object of the present invention is to reduce errors caused by gate current of a switch device if switch devices are non-insulated gate transistors such as J-FET, MESFET, SIT, and HEMT.

The analog signal sampling circuit constructed with field-effect transistors, according to the present invention, comprises an inverting amplifier, a capacitor (one plate of which is connected to an input of the inverting amplifier), a first switch for selecting an input signal to be applied to the other plate of the capacitor between a reference voltage and a sampled signal in accordance with a clock signal CK, and a second switch including a field-effect transistor, which opens or closes the connection between the input and output of the inverting amplifier in accordance with the clock signal by changing the conductance of the field-effect transistor. The first switch performs the selecting so that the capacitor is connected to the signal source to be sampled, when the second switch is closed, and to the reference voltage when the second switch is open, thus obtaining an output that is proportional to the difference between the sampled signal and reference voltage held on the capacitor. To achieve the above object, a voltage converting circuit is included by which the operating voltage of the clock signal applied to the gate of a field-effect transistor forming the second switch, to cause the field-effect transistor to conduct, is converted to a voltage level that can cause the field-effect transistor to conduct when a voltage of the self-bias level of the inverting amplifier is applied to a control terminal of the field-effect transistor.

In prior art circuits, when an enhancement-mode field-effect transistor, for example, is used as the second switch, a clock signal having an amplitude corresponding to the operating voltage range of the circuit was applied. The parasitic capacitance associated with the field-effect transistor forming the second switch contributes to the error in proportion to the voltage amplitude of the clock signal applied to the gate of the field-effect transistor. Accordingly, the error can be reduced if the voltage amplitude of the clock signal is reduced by means of the voltage converting circuit to within the range where the field-effect transistor can function as the second switch.

According to the invention, the amplitude voltage of the clock signal can be reduced to within the range where the field-effect transistor can function as the second switch.

BRIEF DESCRIPTION OF THE DRAWINGS

The present invention will be more clearly understood from the description as set forth below with reference to the accompanying drawings, wherein:

FIG. 21 is a diagram showing the internal configuration of a full differential operational amplifier in the sixth embodiment of the present invention.

DESCRIPTION OF THE PREFERRED EMBODIMENTS

Figure 1:
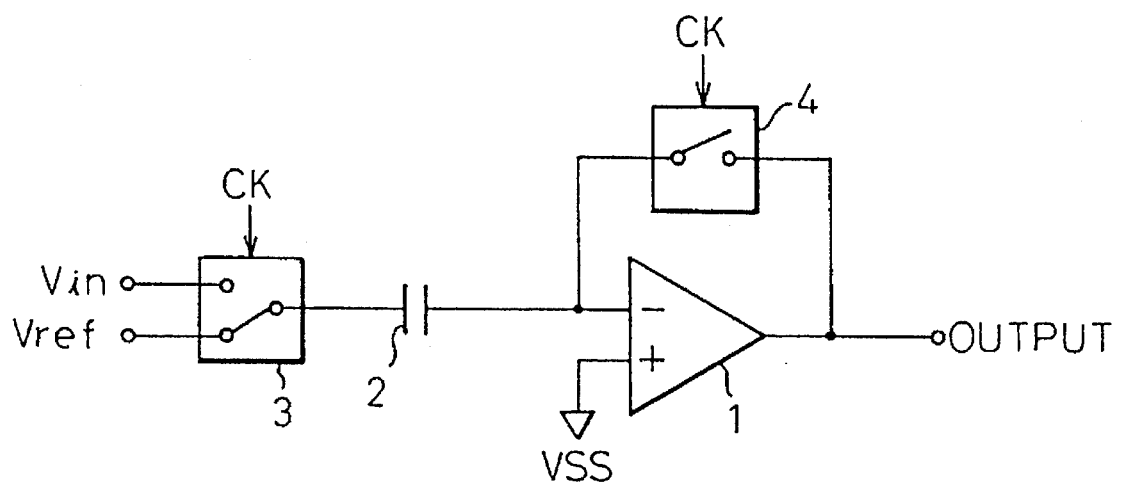
FIG. 1 is a diagram showing the basic configuration of an analog signal sampling circuit.

Before proceeding to a detailed description of the preferred embodiments of the present invention, prior art analog signal sampling circuits will be described for a clearer understanding of the differences between the present invention and the prior art.

For convenience of explanation, the same functional parts are designated by the same reference numerals throughout the drawings used in the following description.

FIG. 1 is a diagram showing the basic configuration of an analog signal sampling circuit.

Figure 2A:
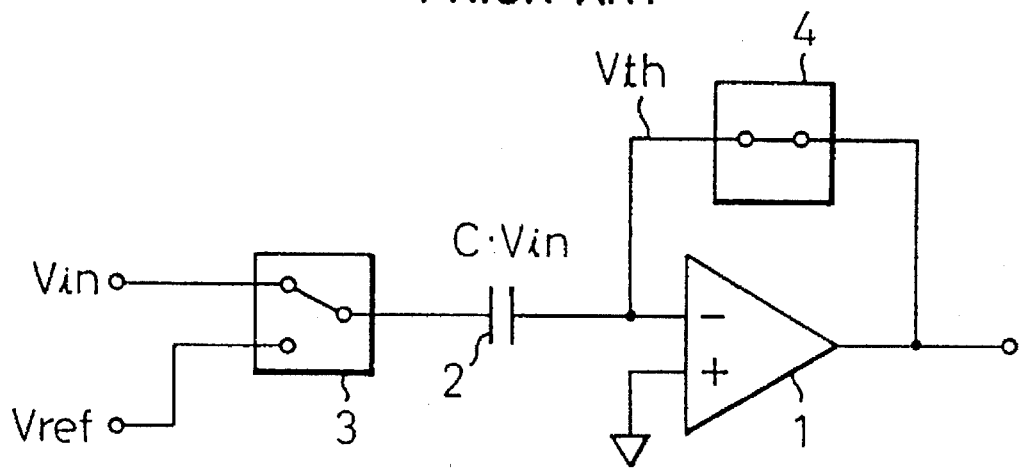
FIGS. 2A and 2B are diagrams for explaining the operation of the analog signal sampling circuit.
Figure 2B:
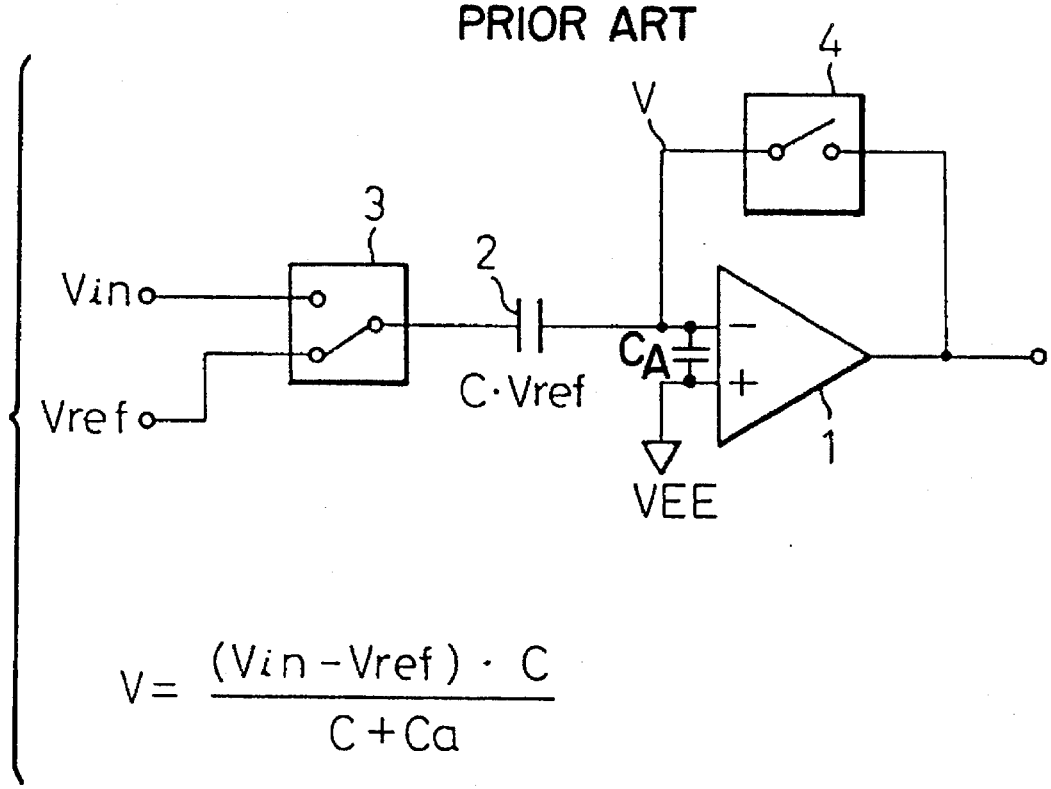

In FIG. 1, the reference numeral 1 is an inverting amplifier, 2 is a capacitor having a capacitance C, 3 is a first switch for selecting a sampled signal voltage Vin or a reference voltage Vref for input to the capacitor 2 in accordance with a clock signal CK, and 4 is a second switch for connecting and disconnecting an input terminal of the inverting amplifier 1 to and from an output terminal thereof in accordance with the clock signal. FIGS. 2A and 2B are diagrams for explaining the operation of the analog signal sampling circuit of FIG. 1. With reference to these figures, the operation of the analog signal sampling circuit will be described below.

The first switch 3 and the second switch 4 each switch to one or other position in accordance with the clock signal CK. FIGS. 2A and 2B show the switch positions corresponding to different states of the clock signal CK. In FIG. 2A, the first switch 3 is connected to the signal voltage Vin, while the second switch 4 is closed. At this time, since the capacitor 2 is supplied with the signal voltage Vin, a charge CVin is stored on it. Further, since the input and output terminals of the inverting amplifier 1 are short-circuited, the voltage level at the input terminal is equal to the self-bias level of the inverting amplifier 1. In this condition, the state of the clock signal CK changes, and the condition of FIG. 2B is achieved, in which the second switch 4 is open and then the first switch 3 is connected to the reference voltage Vref. As a result, the input terminal of the inverting amplifier 1 is disconnected from the output terminal thereof, and the charge stored on the capacitor 2 changes to CVref. At this time, the voltage V at the input terminal of the inverting amplifier 1 is given by Equation (1)

$$V=C(Vin-Vref)/(C+Ca) \qquad (1)$$

where Ca is the parasitic capacitance associated with the input terminal of the inverting amplifier, but excluding the capacitance of the capacitor 2.

Since C, Ca, and Vref are constant, the input terminal voltage V, and hence the output voltage, varies in proportion to Vin.

In a practical A/D converter, multi-bit conversion is achieved either by using a plurality of such analog signal sampling circuits with different reference voltages or by using one such analog signal sampling circuit and sequentially varying the reference voltage level.

Figure 3:
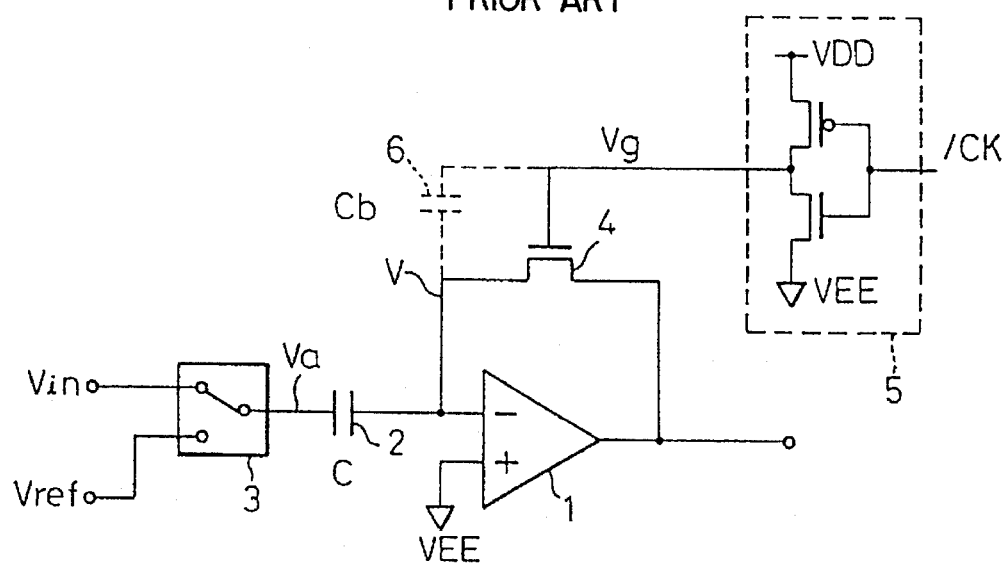
FIG. 3 is a diagram for explaining a parasitic capacitance in the analog signal sampling circuit.
Figure 4:
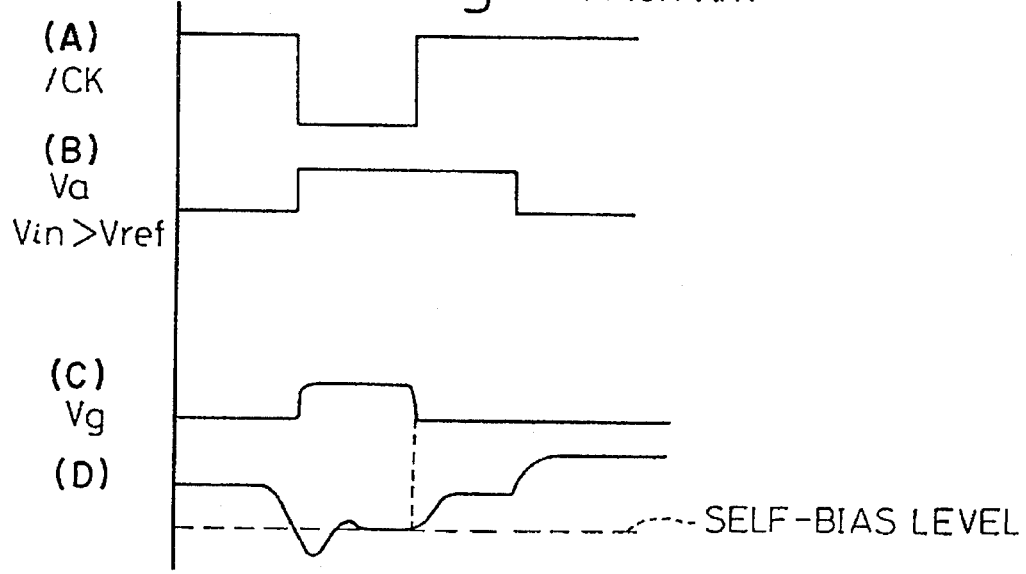
FIG. 4 is a timing chart for explaining the effects so called charge-injection of the parasitic capacitance in the analog signal sampling circuit.

When constructing a DSP having an analog signal sampling circuit such as shown in FIG. 1, metal-oxide semiconductor field-effect transistors (MOSFETs) are commonly used because of their high level of integration. When a high-speed analog signal sampling circuit is needed, metal semiconductor (MES) FETs formed from GaAs semiconductor are used. FIG. 3 shows a MOSFET implementation of the second switch 4, and FIG. 4 is a timing chart for explaining its operation.

As shown in FIG. 3, the second switch 4 is formed from an n-channel enhancement-mode MOSFET. In FIG. 3, the reference numeral 5 is an inverter circuit that generates a signal to be applied to the gate of the n-channel MOSFET in accordance with an inverted clock signal/CK; the supply voltage VDD or the circuit ground voltage VSS is an output level of this inverter circuit. The n-channel MOSFET, acting as the second switch 4, is put in the conducting state when VDD is applied, and in the nonconducting state, namely, in the insulating state when VSS is applied. When the input is switched to the signal voltage Vin to be measured, and the n-channel MOSFET 4 is put in the conducting state, the input and output of the inverting amplifier 1 are short-circuited, so that both the input and output are held at the self-bias level of the inverting amplifier 1. When the n-channel MOSFET 4 is put in the nonconducting state, and the input is switched to the reference voltage Vref, a voltage in proportion to the difference between the signal voltage Vin and the reference voltage Vref is now applied to the input of the inverting amplifier 1, which then outputs an amplified signal of polarity opposite to the input voltage polarity with respect to the self-bias level.

In the circuit of FIG. 3, a parasitic capacitance exists between the input terminal of the inverting amplifier 1 and the source of the n-channel MOSFET 4. In FIG. 3, this parasitic capacitance is indicated by reference numeral 6, and its value is denoted by Cb. Since the voltage at one plate of this parasitic capacitance varies with the clock signal, the amount of charge stored in this parasitic capacitance varies according to the state of the clock signal, affecting the voltage being applied to the input terminal of the inverting amplifier 1. In Equation (1) expressing the input terminal voltage V of the inverting amplifier 1, the parasitic capacitance between the input terminal of the inverting amplifier 1 and the source of the n-channel MOSFET 4 forming the second switch 4 is not taken into account. If this parasitic capacitance is taken into account, the input terminal voltage V of the inverting amplifier 1 is given by Equation (2)

$$V=(C(Vin-Vref)-Cb(VDD-VSS))/(C+Ca) \quad (2)$$

In Equation (2), Ca includes Cb.

As can be seen from the comparison between Equations (1) and (2), the change in the amount of charge due to the parasitic capacitance associated with the gate of the n-channel MOSFET 4 represents an error.

In low-resolution A/D conversion systems, this error does not present any serious problems, but in high-resolution A/D conversion systems, this error is not negligible.

Figure 5:
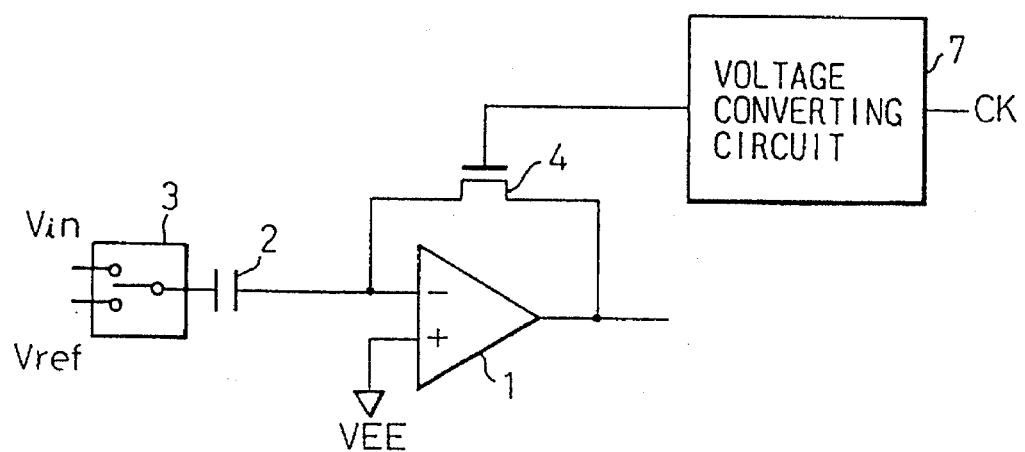
FIG. 5 is a diagram showing the basic configuration of an analog signal sampling circuit according to the present invention.
Figure 6:
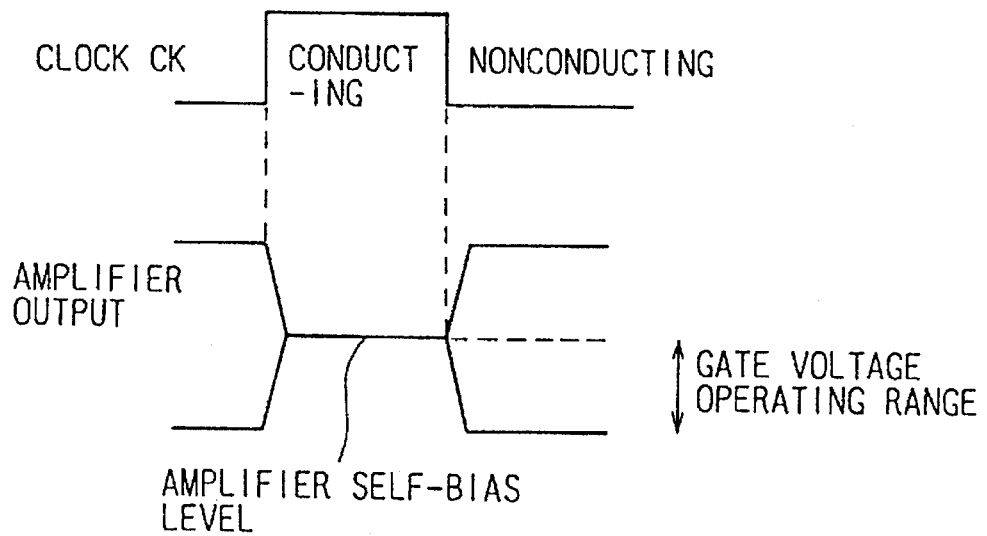
FIG. 6 is a timing chart for explaining the basic operation of the analog signal sampling circuit according to the present invention.

FIG. 5 is a diagram showing the basic configuration of an analog signal sampling circuit constructed with field-effect transistors, according to the present invention. FIG. 6 is a timing chart for explaining the operation of the circuit of FIG. 5.

As shown in FIG. 5, the analog signal sampling circuit of the invention, which is constructed with field-effect transistors, comprises an inverting amplifier 1, a capacitor 2 one plate of which is connected to an input of the inverting amplifier 1, a first switch 3 for selecting a reference voltage Vref or a sampled signal Vin for input to the other plate of the capacitor 2 in accordance with a clock signal CK, and a second switch 4 for opening or closing the connection between the input and output of the inverting amplifier 1 in accordance with the clock signal CK. The first switch 3 performs the switching so that the capacitor 2 is connected to the signal source Vin to be sampled, when the second switch 4 is in the conducting state, and to the reference voltage Vref when the second switch 4 is in the nonconducting state, thus obtaining an output that is proportional to the difference between the sampled signal Vin and reference voltage Vref held in the capacitor 2. There is also included a voltage converting circuit 7 by which the operating voltage of the clock signal CK applied to the gate of the field-effect transistor forming the second switch 4, to cause the field-effect transistor to conduct, is converted to a voltage level that can cause the field-effect transistor to conduct when a voltage at the self-bias level of the inverting amplifier 1 is applied to a controlled terminal of the field-effect transistor.

In prior art circuits, when an enhancement-mode field-effect transistor, for example, is used as the second switch, a clock signal having an amplitude corresponding to the operating voltage range of the circuit was applied, as shown in FIG. 4. The parasitic capacitance associated with the gate of the field-effect transistor acting as the second switch 4 contributes to the error in proportion to the amplitude voltage of the clock signal applied to the gate of the field-effect transistor, as previously shown by Equation (2). Accordingly, the error can be reduced if the amplitude voltage of the clock signal is reduced by means of the voltage converting circuit 7 to the range where the field-effect transistor can function as the second switch 4.

The amplitude voltage of the clock signal can be reduced to the range where the field-effect transistor can function as the second switch 4. This range will be explained with reference to FIGS. 5 and 6.

As the clock signal CK changes, the n-channel enhancement-mode FET acting as the second switch 4 is switched between the conducting and nonconducting states. When the n-channel enhancement-mode FET is in the conducting state, the input and output of the inverting amplifier 1 are short-circuited, so that the input and output of the inverting amplifier 1 are held at the self-bias level of the inverting amplifier 1. For the n-channel enhancement-mode FET to conduct, it is required that the voltage applied to the gate of the n-channel enhancement-mode FET be slightly higher than the self-bias level of the inverting amplifier 1. When the n-channel enhancement-mode FET is in the nonconducting state, the output of the inverting amplifier 1 changes to one or another limit of the operating voltage range of the inverting amplifier 1, depending on the input state. In particular, when the output is at the lower limit of the operating voltage range, the voltage applied to the gate of the n-channel enhancement-mode FET must be near the lower limit of the operating voltage range of the inverting amplifier 1 if the FET is to be kept in the nonconducting state. Therefore, when the voltage range of the clock signal applied to the gate of the n-channel enhancement-mode FET is set between a voltage level slightly higher than the self-bias level of the inverting amplifier 1 and the lower limit of the output voltage range of the inverting amplifier 1, the FET can serve the function of the second switch. Note that the symbol for the n-channel enhancement-mode FET shown in the above figure will also be used in the figures hereinafter described.

Figure 7:
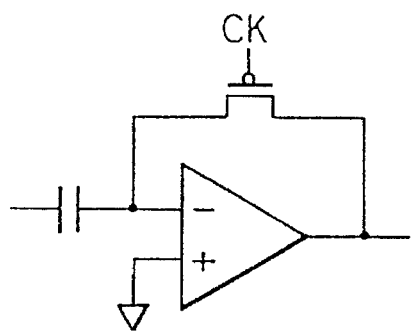
FIG. 7 is a circuit diagram of a second switch formed by a p-channel enhancement-mode FET.
Figure 8:
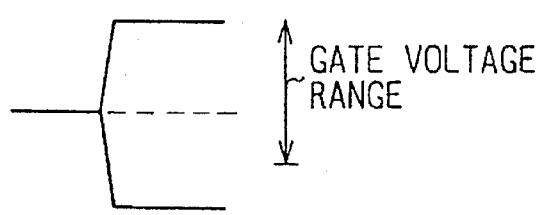
FIG. 8 is a diagram showing a gate voltage range for the circuit of FIG. 7.
Figure 9:
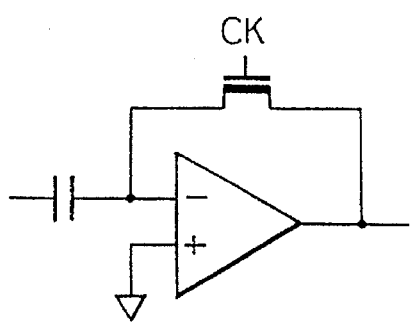
FIG. 9 is a circuit diagram of a second switch formed by an n-channel depletion-mode FET.
Figure 10:
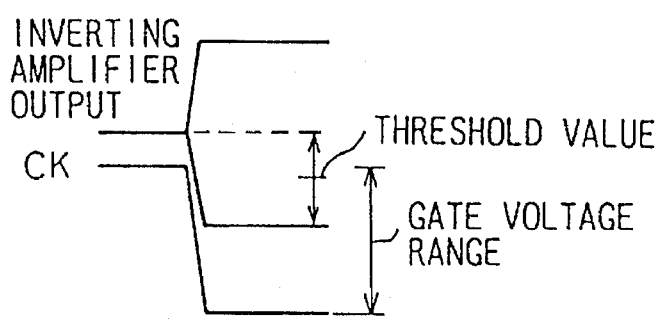
FIG. 10 is a diagram showing a gate voltage range for the circuit of FIG. 9.
Figure 11:
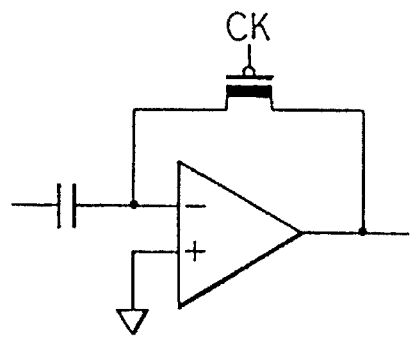
FIG. 11 is a circuit diagram of a second switch formed by a p-channel depletion-mode FET.
Figure 12:
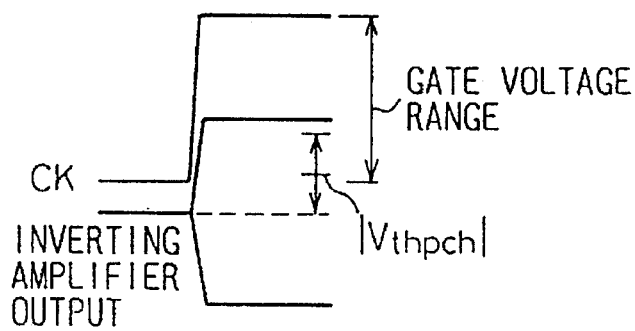
FIG. 12 is a diagram showing a gate voltage range for the circuit of FIG. 11.

FIGS. 7 to 12 show voltage ranges for the clock signal when the second switch is constructed from different types of switch device. FIG. 7 shows the circuit when a p-channel enhancement-mode FET is used, and FIG. 8 shows the gate voltage range for the circuit of FIG. 7. FIG. 9 is a circuit diagram when an n-channel depletion-mode FET is used, and FIG. 10 shows the gate voltage range for the circuit of FIG. 9. FIG. 11 is a circuit diagram when a p-channel depletion-mode FET is used, and FIG. 12 shows the gate voltage range for the circuit of FIG. 11.

As shown, in the case of the p-channel enhancement-mode FET, the upper limit of the output voltage range of the inverting amplifier 1 is taken to determine one range of the clock signal. For the depletion-mode device, the range needs to be offset by the threshold voltage, the voltage required to turn off the FET.

In any case, the error is reduced since the amplitude of the clock signal applied to the gate of the FET acting as the second switch is reduced.

Figure 13:
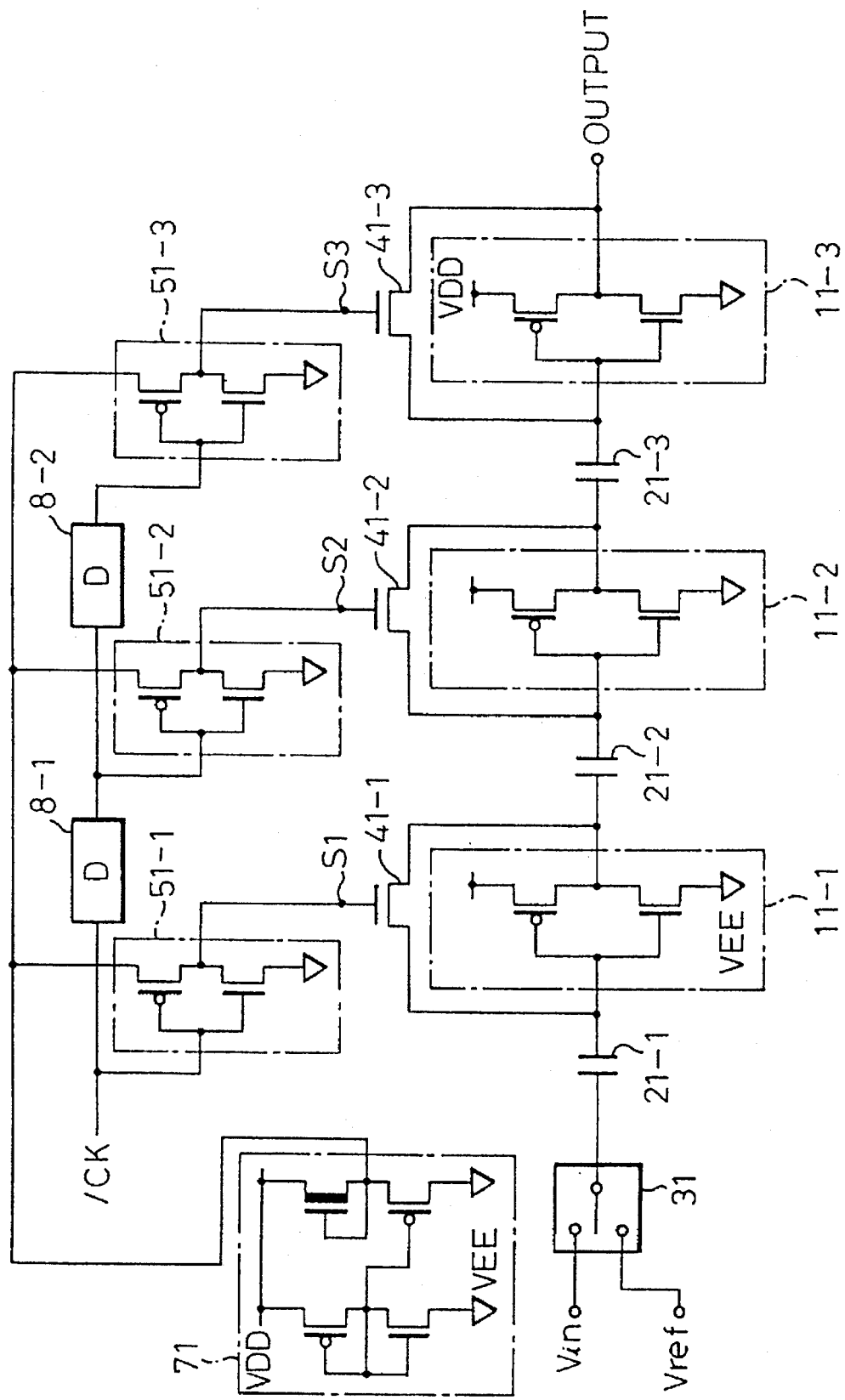
FIG. 13 is a diagram showing a circuit configuration according to a first embodiment of the present invention.

FIG. 13 is a diagram showing a circuit configuration according to a first embodiment of the invention.

As shown, in the first embodiment, a CMOS-type inverter circuit is used as the inverting amplifier; three stages of such inverter circuits are connected to realize a MOSFET sampling circuit. In FIG. 13, the reference numerals 11-1, 11-2, and 11-3 are the inverter circuits; 21-1, 21-2, and 21-3 are the respective capacitors; 31 is the first switch; and 41-1, 41-2, and 41-3 are the respective second switches. The numerals 51-1, 51-2, and 51-3 are gate clock generators for generating gate clock signals S1, S2, and S3, respectively, which are applied to the respective second switches in accordance with the inverted clock signal/CK; and 8-1 and 8-2 are delay circuits for delaying the inverted clock signal/CK to be applied to the gate clock generators 51-2 and 51-3. The numeral 71 indicates a voltage converting circuit for converting the voltage for supply to the gate clock generators 51-1, 51-2, and 51-3.

The voltage converting circuit 71 contains an inverter circuit having the same β ratio as the inverter circuits 11-1, 11-2, and 11-3; since the input and output of this inverter circuit is connected together, the output of this inverter circuit is equal to the self-bias level Vthi. The output of this inverter circuit is applied to the gate of a p-channel enhancement-mode MOSFET which is connected in series with an n-channel depletion-mode MOSFET between the power supplies VDD and VEE. Therefore, when the threshold value of the p-channel enhancement-mode MOSFET is Vtp, the output of the voltage converting circuit 71 is Vthi+Vtp+ΔV. Since this output is applied to the gate clock generators 51-1, 51-2, and 51-3, the upper and lower limits of the amplitude of each gate clock signal are determined by Vthi and the threshold $\phi$ of the n-channel enhancement-mode MOSFET, respectively. As previously described, with the signal of such amplitude, the second switches 41-1, 41-2, and 41-3 are capable of performing the required on/off operations.

Figure 14:
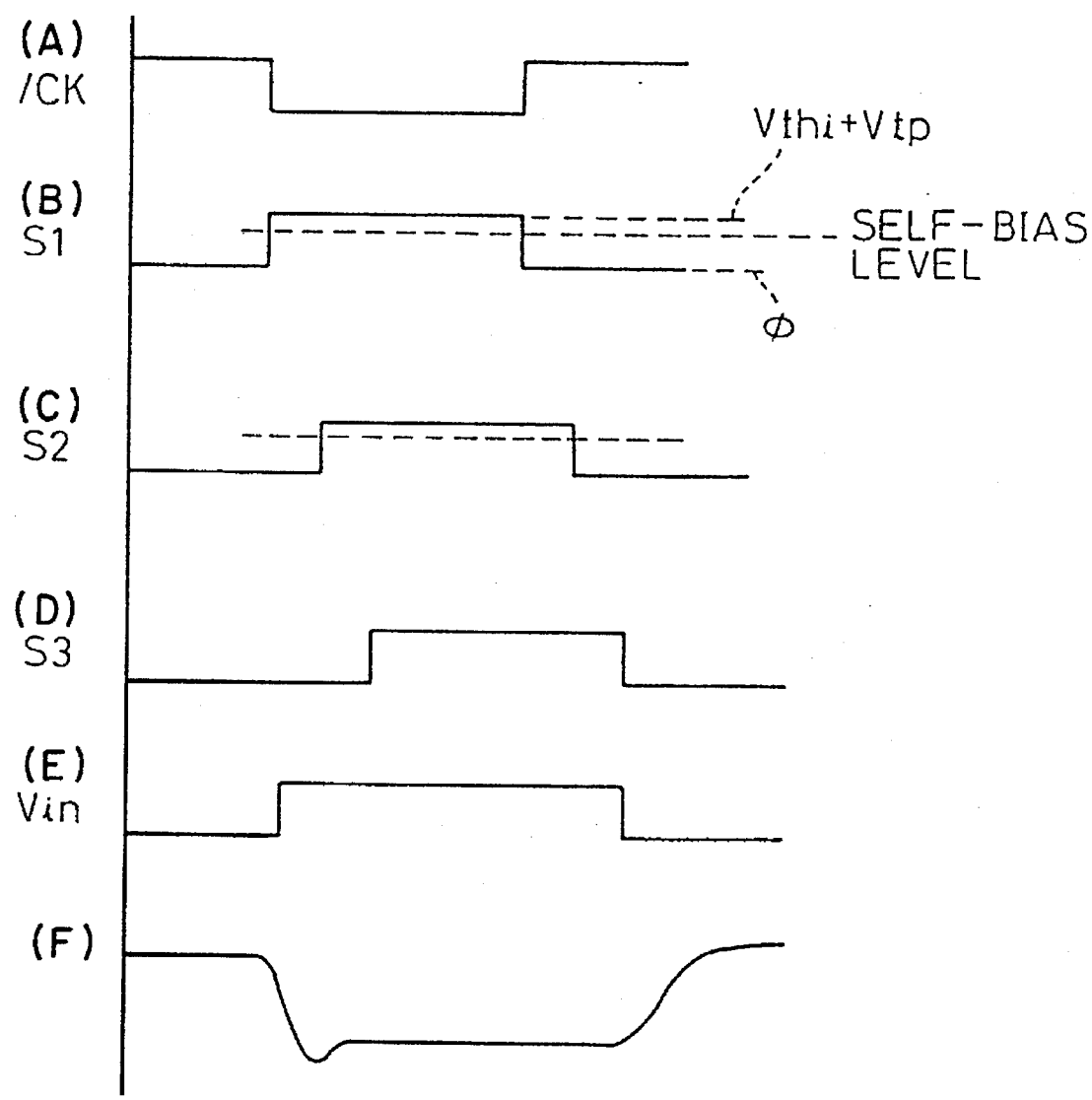
FIG. 14 is a diagram for explaining the operation of various parts in the first embodiment of the present invention.

FIG. 14 is a diagram for explaining the operation of the circuit of FIG. 13.

As the inverted clock signal/CK changes, the gate clock signals S1, S2, and S3 change as shown. S2 is delayed with respect to S1 by the time delay introduced by the delay circuit 8-1, and S3 is delayed with respect to S2 by the time delay introduced by the delay circuit 8-2. The upper and lower limits of the amplitude are determined by Vthi–Vtp and $\phi$, as noted above. The circuit of FIG. 13 is supplied with the sampled signal voltage Vin for an interval that starts at the time when S1 rises to Vthi–Vtp and that lasts until the S3 falls to $\phi$; after that, the reference voltage Vref is supplied to this circuit. When all the gate clock signals are at Vthi, and the signal voltage Vin is supplied, the n-channel enhancement-mode MOSFETs of all the second switches 41-1, 41-2, and 41-3 are conducting, and the amount of charge corresponding to the signal voltage Vin accumulates in the first capacitor 21-1. When the n-channel enhancement-mode MOSFETs of the second switches 41-1 and 41-2 are successively put in the nonconducting state, the output does not change since there is no change in the input signal. When the last n-channel enhancement-mode MOSFET 41-3 is put into the nonconducting state, and the input signal switches to the reference voltage Vref, then a voltage in proportion to the change in the input voltage appears at the output of the first stage, and is propagated to the later stages in sequence.

The output is thus obtained that is proportional to the difference between the input signal voltage Vin and the reference voltage Vref. Since the voltages applied to the n-channel enhancement-mode MOSFETs 41-1, 41-2, and 41-3, each acting as the second switch, are reduced as compared with the prior art circuits, the error is reduced.

A second embodiment of the invention will be described below, in which a full differential operational amplifier based on MOSFET is used as the inverting amplifier.

Figure 15:
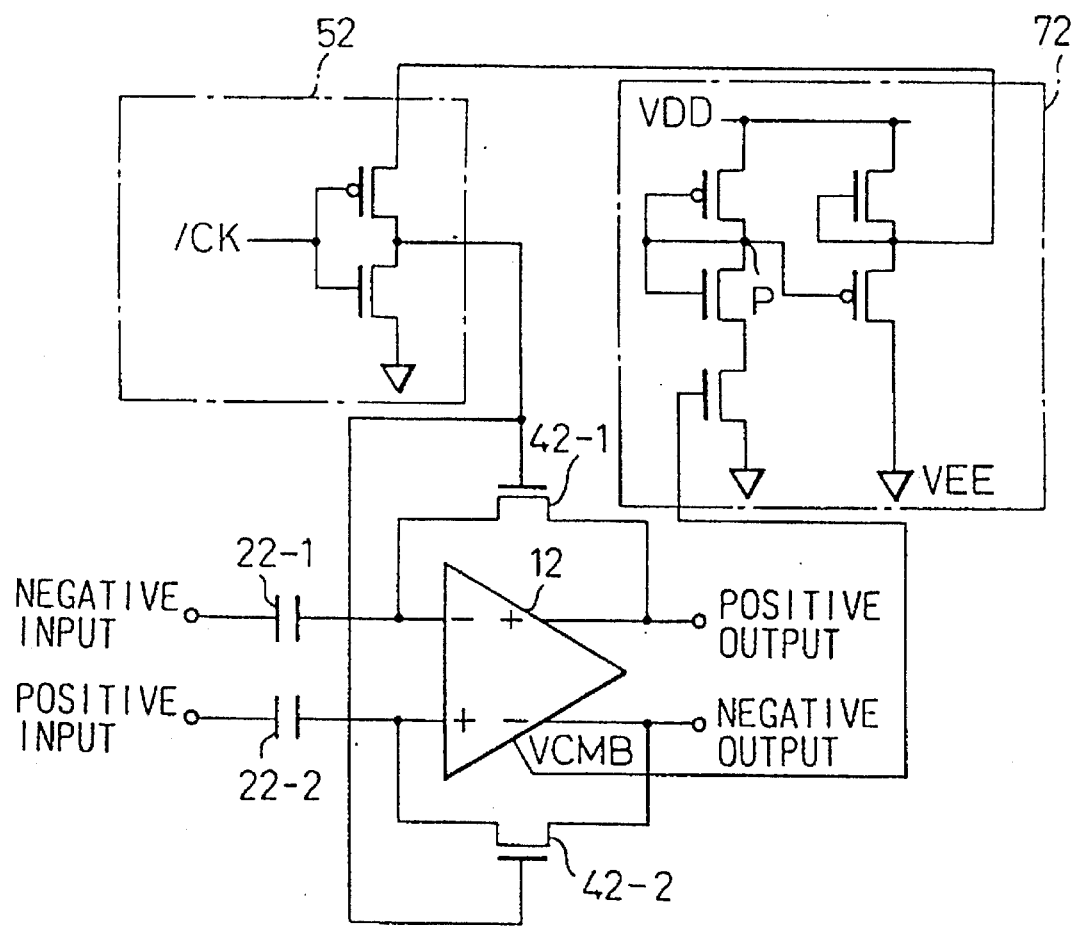
FIG. 15 is a diagram showing a circuit configuration according to a second embodiment of the present invention.
Figure 16:
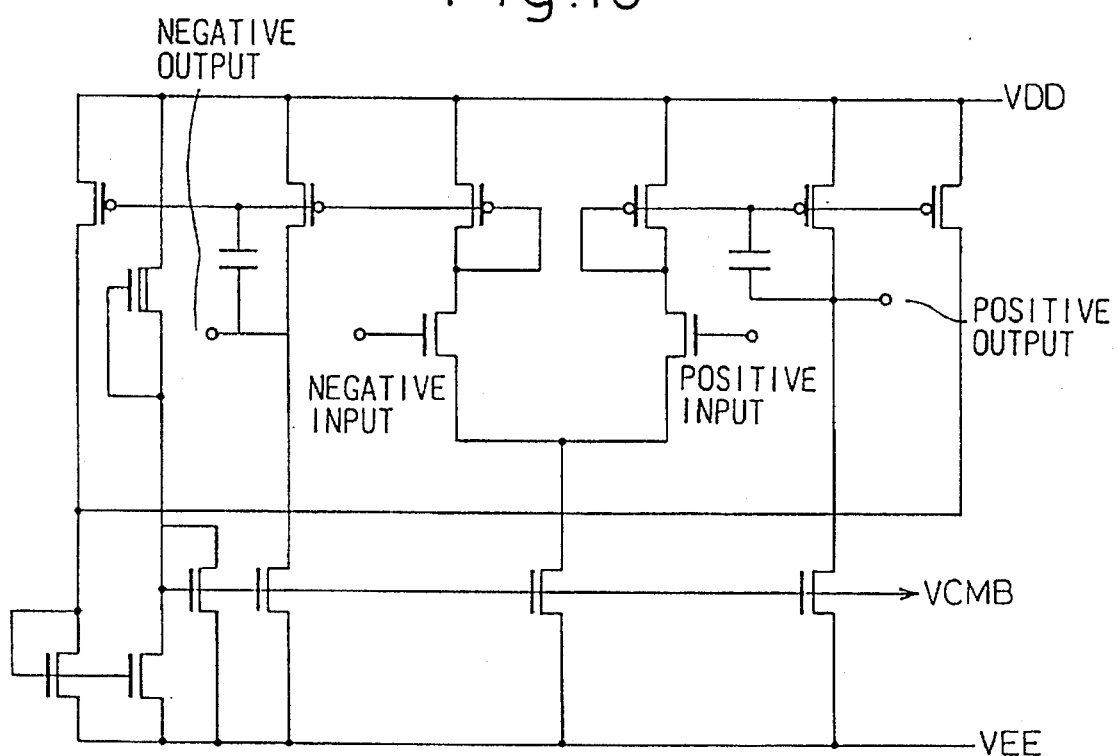
FIG. 16 is a diagram showing the internal configuration of a full differential operational amplifier in the second embodiment of the present invention.

FIG. 15 shows the circuit configuration of the second embodiment, and FIG. 16 is a diagram showing the internal configuration of the full differential operational amplifier. The first switch is not shown here.

In FIG. 15, the reference numeral 12 is the fully differential operational amplifier; 22-1 and 22-2 are capacitors; 42-1 and 42-2 are n-channel enhancement-mode MOSFETs each corresponding to the second switch; 52 is a gate clock generator; and 72 is a voltage converting circuit. The internal configuration and the operation of the fully differential operational amplifier shown in FIG. 16 are well known, and therefore, a detailed explanation thereof is omitted here. The following description focuses on the voltages applied to the gates of the n-channel enhancement-mode MOSFETs 42-1 and 42-2 each acting as the second switch.

As shown in FIGS. 15 and 16, the gate voltage (common-mode-feedback voltage) (VCMFB) for the load transistors on the negative power supply line in the fully differential operational amplifier 12 is also applied to the load transistor in the voltage converting circuit 72; therefore, the voltage at node P in the voltage converting circuit 72 is equal to the self-bias level Vthj that appears when the input and output of the full differential operational amplifier 12 are short-circuited. Accordingly, as in the case of the previous example, the upper and lower limits of the gate clock signal amplitude are determined by Vthj and $\phi$, respectively.

In either of the above embodiments, the circuit is implemented using MOSFETs; on the other hand, for applications where high operating speeds are required, GaAs semiconductors are used, and for such applications, the circuit is constructed using MESFETs. In MOSFETs, very little current flows to the gate, but in MESFETs, current flows through gate schottky diode. Therefore, when the second switch is constructed from a MESFET, there arises the problem that a larger error is caused since the current accumulated in the capacitor flows to the gate even when the second switch formed from a MESFET is in the nonconducting state. Accordingly, when constructing the sampling circuit using MESFETs, it is required not only to reduce the effects of the previously mentioned parasitic capacitance, but also to reduce the amplitude of the clock signal applied to the gate, which is necessary to reduce the current flowing to the gate.

Figure 17:
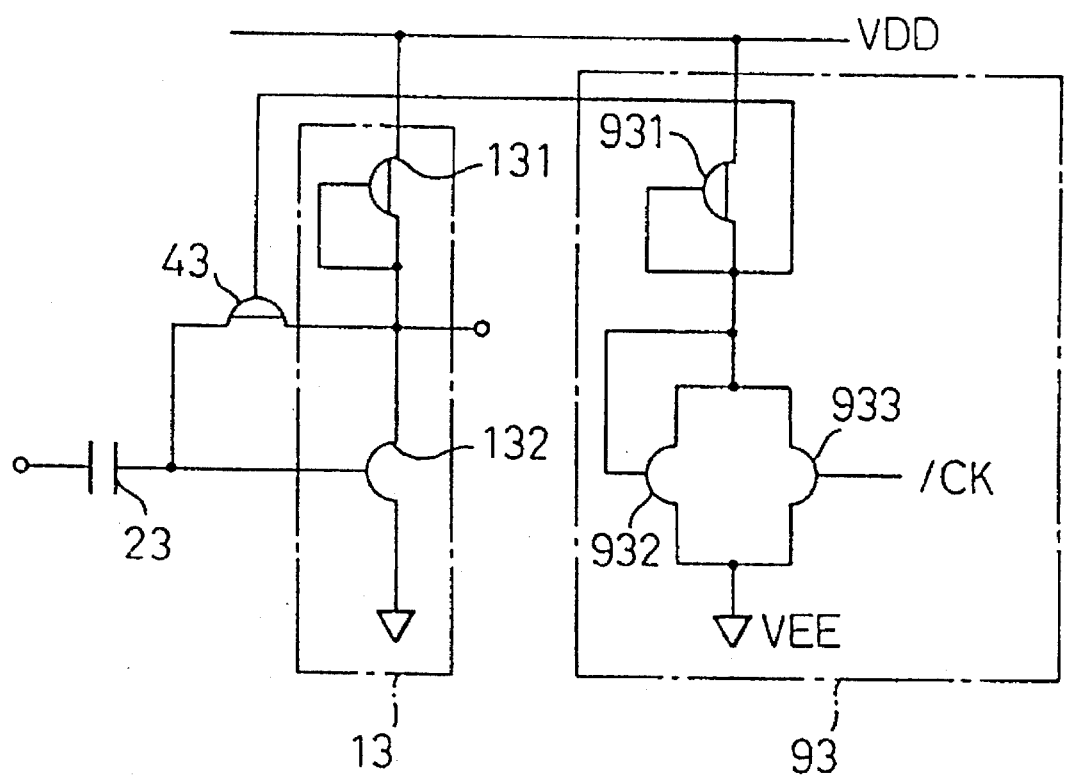
FIG. 17 is a diagram showing a circuit diagram according to a third embodiment of the present invention.

FIG. 17 is a diagram showing the circuit configuration of a third embodiment wherein the circuit is implemented using MESFETs, the circuit containing an inverter circuit acting as the inverting amplifier.

In FIG. 17, 13 is the inverter circuit; 23 is a capacitor; 43 is an n-channel depletion-mode MESFET corresponding to the second switch; and 93 is a clock signal section that carries out the functions of the voltage converting circuit and gate clock generator. When the inverted clock signal/CK is high, the n-channel enhancement-mode MESFET 933 to which the inverted clock signal/CK is applied is ON, so that VEE is applied to the n-channel depletion-mode MESFET 43 acting as the second switch. When the inverted clock signal/CK is low, the n-channel enhancement-mode MESFET 933 is OFF, so that the clock signal section 93 is put in the same condition as when the input and output of the inverter circuit are short-circuited, and the self-bias level Vthi of the inverter circuit 13 is applied to the n-channel depletion-mode MESFET 43. Thus, the n-channel depletion-mode MESFET 43 is supplied at its gate with the clock signal whose upper and lower amplitude limits are determined by Vthi and VSS, respectively.

Figure 18:
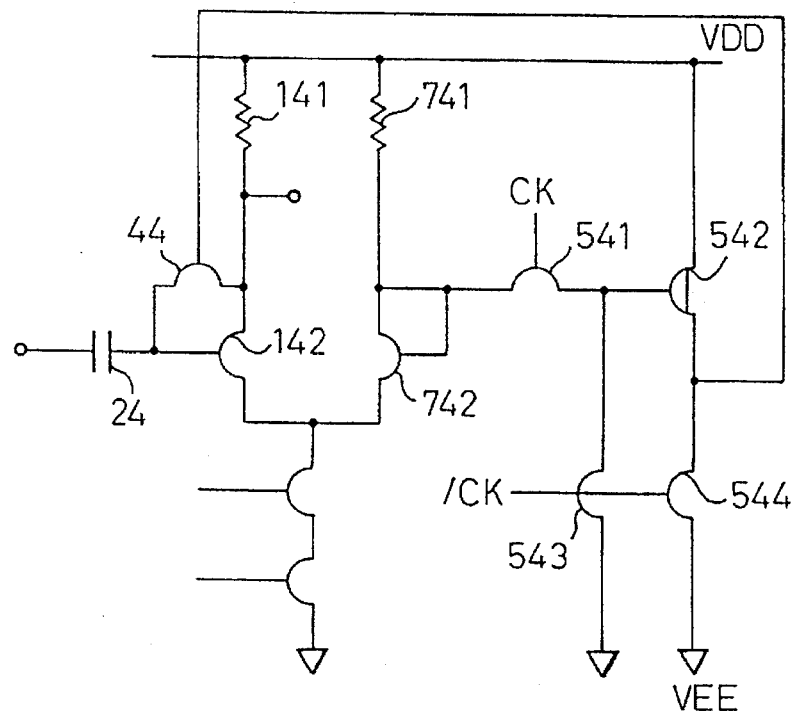
FIG. 18 is a diagram showing a circuit diagram according to a fourth embodiment of the present invention.

FIG. 18 is a diagram showing the circuit configuration of a fourth embodiment wherein the circuit is implemented using MESFETs, the circuit containing an inverter circuit acting as the inverting amplifier, as in the circuit shown in FIG. 17. The n-channel depletion-mode MESFET 131 in the inverter circuit is replaced by a resistor 141. There is also provided a circuit consisting of a resistor 741 and an n-channel enhancement-mode MESFET 742, the configuration being the same as that of the inverter circuit, but with its input and output short-circuited, so that when the clock signal is high, the output of this circuit is applied to the gate of the n-channel enhancement-mode MESFET 44 of the second switch through an n-channel enhancement-mode MESFET 541 and an n-channel depletion-mode MESFET 542. That is, the self-bias level of the inverter circuit is applied to the gate of the n-channel enhancement-mode MESFET 44. On the other hand, when the clock signal CK is low, that is, when the inverted clock signal/CK is high, an n-channel enhancement-mode MESFET 544 is ON, so that VSS is applied to the gate of the n-channel enhancement-mode MESFET 44.

Figure 19:
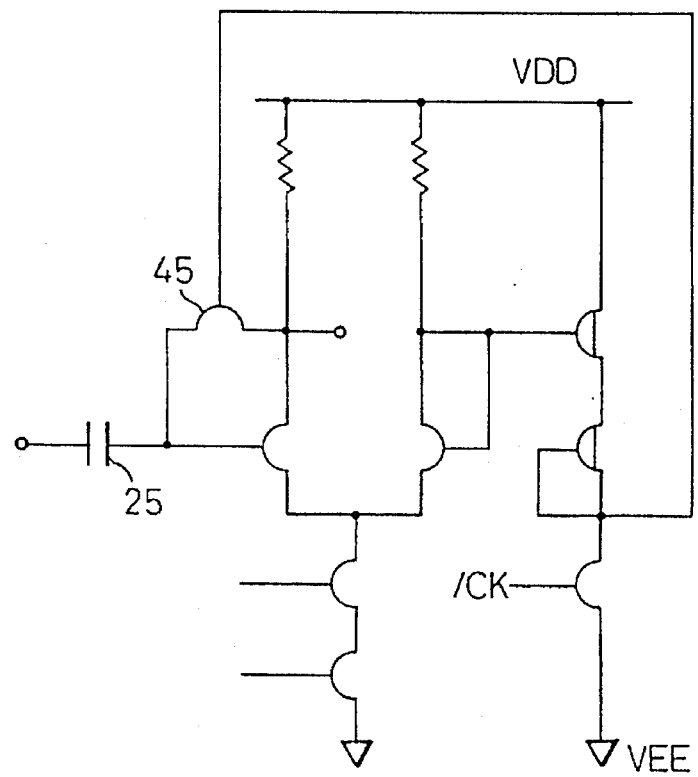
FIG. 19 is a diagram showing a circuit diagram according to a fifth embodiment of the present invention.

FIG. 19 is a diagram showing the configuration of a fifth embodiment. As can be seen from the figure, the circuit of the fifth embodiment is identical in configuration to that of the fourth embodiment, except that the clock signal generator is simplified in the fifth embodiment. The same voltages as described in the fourth embodiments are applied to the gate of the n-channel enhancement-mode MESFET 45.

Figure 20:
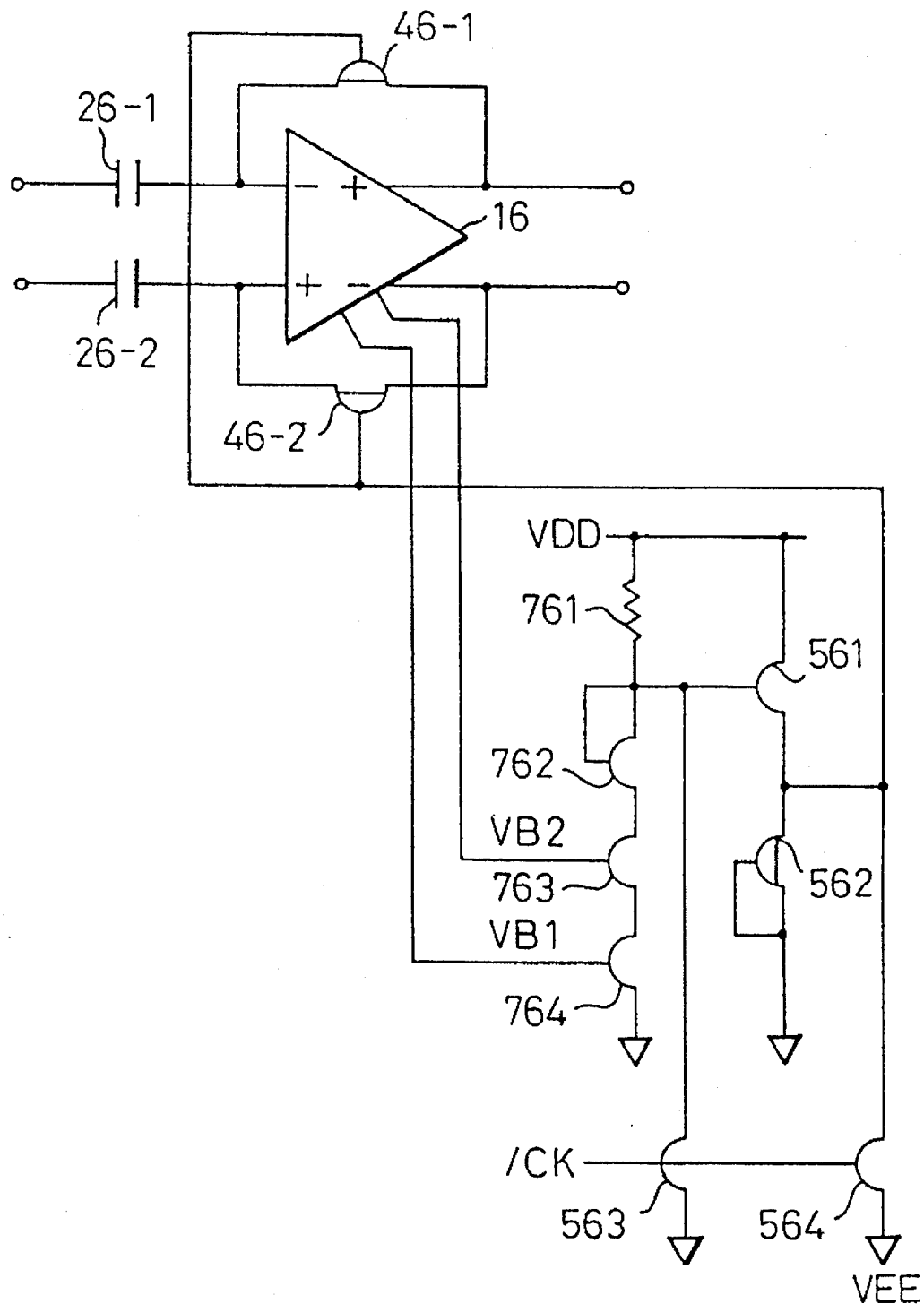
FIG. 20 is a diagram showing a circuit diagram according to a sixth embodiment of the present invention.

FIG. 20 is a diagram showing the circuit configuration of a sixth embodiment. In the circuit of the sixth embodiment, the inverting amplifier is constructed from a full differential operational amplifier which is implemented using MESFETs. The configuration of the fully differential operational amplifier is shown in FIG. 21.

In FIG. 20, 16 is the fully differential operational amplifier; 26-1 and 26-2 are capacitors; and 46-1 and 46-2 are n-channel depletion-mode MESFETs each corresponding to the second switch. The numerals 761 to 764 are elements forming the voltage converting circuit; as is apparent from a comparison with FIG. 21, this circuit is equivalent to the circuit of the fully differential operational amplifier 16 with its input and output short-circuited, and generates a voltage equal to the self-bias level Vthi of the fully differential operational amplifier 16. When the inverted clock signal/CK is low, the voltage Vthi is applied through an n-channel channel enhancement-mode MESFET 561 to the n-channel depletion-mode MESFETs 46-1 and 46-2 each acting as the second switches. Therefore, the voltage applied at this time is equal to the value obtained by subtracting the threshold value Vte of the n-channel enhancement-mode MESFET 561 from Vthi. VEE is applied when the inverted clock signal/CK is high.

As described above, according to the present invention, the analog signal sampling circuit comprises an inverting amplifier, formed from field-effect transistors, and a capacitor and, in accordance with the clock signal, the input to the capacitor is switched between the sampled signal voltage and the reference voltage while short-circuiting the input and output of the inverting amplifier according to the clock signal, thus generating an output that is proportional to the difference between the signal voltage and reference voltage held in the capacitor. In the thus constructed circuit, since the amplitude of the clock signal applied to the switch device is reduced to the minimum required amplitude, errors caused by the parasitic capacitance associated with the switch device can be reduced.

I claim:

1. An analog signal sampling circuit constructed with field-effect transistors, comprising:

an inverting amplifier;

a capacitor, one plate of which is connected to an input of said inverting amplifier;

a first switch for selecting an input signal, to be applied to the other plate of said capacitor, between a reference signal and a sampled signal in accordance with a first clock signal; and a second switch including a field-effect transistor, which opens or closes the connection between the input and output of said inverting amplifier in accordance with a second clock signal by changing the conductance of said field-effect transistor, said first switch performing the selecting so that said capacitor is connected to the signal source to be sampled, when said second switch is closed, and to said reference voltage when said second switch is open, thus obtaining an output that is proportional to the difference between said sampled signal and said reference voltage held in said capacitor; and a voltage converting circuit by which the operating voltage of said second clock signal, applied to the gate of the field-effect transistor forming said second switch to cause said field-effect transistor to conduct, is converted to a voltage level that can cause said field-effect transistor to conduct when a voltage of the self-bias level of said inverting amplifier is applied to a control terminal of said field-effect transistor.

2. An analog signal sampling circuit according to claim 1, wherein said second switch is formed from an n-channel enhancement-mode field-effect transistor, and said second clock signal to be applied to the gate of said n-channel enhancement-mode field-effect transistor varies between a voltage level higher than the self-bias voltage level of said inverting amplifier and the lower-limit operating voltage level of said inverting amplifier.

3. An analog signal sampling circuit according to claim 2, wherein said second switch is formed from a MES field-effect transistor.

4. An analog signal sampling circuit according to claim 1, wherein said second switch is formed from a p-channel enhancement-mode field-effect transistor, and said second clock signal to be applied to the gate of said p-channel enhancement-mode field-effect transistor varies between a voltage level slightly lower than the self-bias voltage level of said inverting amplifier and the higher-limit operating voltage level of said inverting amplifier.

5. An analog signal sampling circuit according to claim 3, wherein said second switch is formed from a MES field-effect transistor.

6. An analog signal sampling circuit according to claim 1, wherein said second switch is formed from an n-channel depletion-mode field-effect transistor, and said second clock signal to be applied to the gate of said n-channel depletion-mode field-effect transistor varies between a voltage level slightly higher than the voltage level obtained by adding the self-bias level of said inverting amplifier to the threshold value (negative value) of said n-channel depletion-mode field-effect transistor and a voltage level equal to or lower than the voltage level obtained by adding the self-bias level of said inverting amplifier to the threshold value (negative value) of said n-channel depletion-mode field-effect transistor.

7. An analog signal sampling circuit according to claim 6, wherein said second switch is formed from a MES field-effect transistor.

8. An analog signal sampling circuit according to claim 1, wherein said second switch is formed from an p-channel depletion-mode field-effect transistor, and said second clock signal to be applied to the gate of said p-channel depletion-mode field-effect transistor varies between a voltage level slightly lower than the voltage level obtained by subtracting the threshold value (positive value) of said p-channel depletion-mode field-effect transistor from the self-bias level of said inverting amplifier and a voltage level equal to or higher than the voltage level obtained by subtracting the threshold value (positive value) of said p-channel depletion-mode field-effect transistor from the self-bias level of said inverting amplifier.

9. An analog signal sampling circuit according to claim 8, wherein said second switch is formed from a MES field-effect transistor.

10. An analog signal sampling circuit according to claim 1, wherein said inverting amplifier is a one-input, one-output inverter circuit.

11. An analog signal sampling circuit according to claim 1, wherein said inverting amplifier is a two-input, one-output differential circuit.

12. An analog signal sampling circuit according to claim 1, wherein said inverting amplifier is a two-input, two-output differential amplifier circuit.

13. An analog signal sampling circuit according to claim 1, wherein said second switch is formed from a MES field-effect transistor.

14. An analog-to-digital converter for converting an analog signal into a digital signal with reference to a reference voltage, comprising:

an analog signal sampling circuit constructed with field-effect transistors as an signal input portion for receiving said analog signal to be sampled and said reference voltage, said analog signal sampling circuit including:

an inverting amplifier;

a capacitor, one plate of which is connected to an input of said inverting amplifier;

a first switch for selecting an input signal, to be applied to the other plate of said capacitor, between said reference signal and said sampled analog signal in accordance with a first clock signal; and a second switch including a field-effect transistor, which opens or closes the connection between the input and output of said inverting amplifier in accordance with a second clock signal by changing the conductance of said field-effect transistor, said first switch performing the selecting so that said capacitor is connected to the signal source to be sampled, when said second switch is closed, and to said reference voltage when said second switch is open, thus obtaining an output that is proportional to the difference between said sampled analog signal and said reference voltage held in said capacitor; and a voltage converting circuit by which the operating voltage of said second clock signal, applied to the gate of the field-effect transistor forming said second switch to cause said field-effect transistor to conduct, is converted to a voltage level that can cause said field-effect transistor to conduct when a voltage of the self-bias level of said inverting amplifier is applied to a control terminal of said field-effect transistor.

15. An analog signal sampling circuit including field-effect transistors, said circuit comprising:

an inverting amplifier having a self-bias level;

a first switch including a field-effect transistor with a control terminal and a gate;

a voltage converting circuit by which an operating voltage of a clock signal applied to the gate of the field-effect transistor forming said first switch to cause said field-effect transistor to conduct, is converted to a voltage level that can cause said field-effect transistor to conduct when a voltage of the self-bias level of the inverting amplifier is applied to the control terminal of said field-effect transistor.

\* \* \* \* \*